United States Patent
Täschner et al.

[11] Patent Number: 6,139,921
[45] Date of Patent: Oct. 31, 2000

[54] METHOD FOR DEPOSITING FINE-GRAINED ALUMINA COATINGS ON CUTTING TOOLS

[75] Inventors: Christine Täschner; Ingolf Endler; Albrecht Leonhardt, all of Dresden, Germany; Björn Ljungberg, Enskede; Mats Sjöstrand, Kista, both of Sweden

[73] Assignee: Sandvik AB, Sandviken, Sweden

[21] Appl. No.: 09/197,639

[22] Filed: Nov. 23, 1998

[30] Foreign Application Priority Data

Nov. 26, 1997 [SE] Sweden ................................. 9704387

[51] Int. Cl.$^7$ .............................. H05H 1/24; B05D 3/06
[52] U.S. Cl. .................... 427/576; 427/573; 427/255.34; 51/309
[58] Field of Search ...................... 427/576, 573, 427/255.34, 255.39; 51/309; 407/119

[56] References Cited

U.S. PATENT DOCUMENTS

| | | |
|---|---|---|
| 5,093,151 | 3/1992 | van den Berg et al. . |
| 5,173,328 | 12/1992 | Reiter et al. . |
| 5,516,588 | 5/1996 | van den Berg et al. . |
| 5,587,233 | 12/1996 | König et al. . |
| 5,698,314 | 12/1997 | Goedicke et al. . |
| 6,005,218 | 12/1999 | Walde et al. ................ 219/121.54 |

FOREIGN PATENT DOCUMENTS

| | | |
|---|---|---|
| 252 205 | 9/1986 | Germany . |
| 195 13 614 | 4/1995 | Germany . |

OTHER PUBLICATIONS

Zywitzki, O., et al., "*Effect of the Substrate Temperature on the Structure and Properties of $Al_2O_3$ Layers Reactively Deposited by Pulsed Magentron Sputtering*", Surface and Coatings Technology, vol. 82, 1996, pp. 169–175 No Month Data?.

Primary Examiner—Roy V. King
Attorney, Agent, or Firm—Burns, Doane, Swecker & Mathis, L.L.P.

[57] ABSTRACT

A method for depositing refractory alumina ($A_2O_3$) thin layers on cutting tools made of cemented carbide, cermet, ceramics or high speed steel is disclosed. The present method is a Plasma Activated Chemical Vapor Deposition (PACVD) process in which the plasma is produced by applying a bipolar pulsed DC voltage across two electrodes to which the tool substrates to be coated are fixtured and electrically connected.

In contrast to prior art methods, built-up electrical charge on non-conducting surfaces is suppressed and hence, no arcing occurs on said surfaces. This will permit stable, long-term processing, With the present method, high-quality coatings of either single phase gamma-$Al_2O_3$ or of a mixture of gamma- and alpha-$Al_2O_3$ phases can be deposited on cutting tools at deposition temperatures as low as 500° C.

When coated cemented carbide tools according to the invention are used in the machining of steel or cast iron, several important improvements to prior art produced $Al_2O_3$-coated tools have been observed.

9 Claims, 7 Drawing Sheets

P+ = Pulse on time positive
t+ = Pulse off time positive
P- = Pulse on time negative
t- = Pulse off time negative
A+, A- = Amplitude
T = period

METHOD FOR DEPOSITING FINE-GRAINED ALUMINA COATINGS ON CUTTING TOOLS

BACKGROUND OF THE INVENTION

The present invention relates to a method for depositing fine-grained, crystalline $Al_2O_3$ (alumina) coatings on cutting tools having a body of cemented carbide, cermet, ceramics or high speed steel by means of a Plasma Activated Chemical Vapor Deposition (PACVD) process with the chemical reactants $AlCl_3$, $O_2$, $H_2$ and Ar. The plasma is produced by applying a bipolar pulsed DC voltage on two electrodes or two sets of electrodes. It is possible, with the present method, to deposit at high deposition rate, smooth, high-quality coatings consisting of either single phase gamma-$Al_2O_3$ or of a mixture of gamma- and alpha-$Al_2O_3$ phases. The coatings have a good wear resistance when applied on cutting tools. With the present method, crystalline $Al_2O_3$ coatings can be obtained at deposition temperatures as low as 500° C. The present method, bipolar pulsed DC voltage PACVD, can also successfully be used for the deposition of non-insulating coatings such as TiC, TiN, TiCN and TiAlN, or other carbides and/or nitrides with the metal element chosen from Nb, Hf, V, Ta, Mo, Zr, Cr, and W.

It is well known that for cemented carbide cutting tools used in metal machining, the wear resistance of the tool can be considerably increased by applying thin, hard surface layers of metal oxides, carbides or nitrides with the metal either selected from the transition metals from the groups IV, V and VI of the Periodic Table or from silicon, boron and aluminum. The coating thickness usually varies between 1 and 15 μm and the most widespread techniques for depositing such coatings are PVD (Physical Vapor Deposition) and CVD (Chemical Vapor Deposition). Cemented carbide cutting tools coated with alumina layers have been commercially available for over two decades. The CVD technique usually employed involves the deposition of material from a reactive gas atmosphere of $AlCl_3$, $CO_2$ and $H_2$, on a substrate surface held at elevated temperatures around 1000°C.

$Al_2O_3$ crystallizes into several different phases such as α (alpha), κ (kappa) and χ (chi) called the "α-series" with hcp (hexagonal close packing) stacking of the oxygen atoms, and into γ (gamma), θ (theta), η (eta) and δ (delta) called the "γ-series" with fcc (face centered cubic) stacking of the oxygen atoms. The most often occurring $Al_2O_3$-phases in coatings deposited with CVD methods on cemented carbides at temperatures 1000°–1050° C., are the stable alpha and the metastable kappa phases, however, the metastable theta phase has occasionally been observed. These $Al_2O_3$ coatings of the α-, κ- and/or θ-phase are fully crystalline with a grain size in the range 0.5–5 μm and the coatings have a well-faceted grain structure.

The inherently high deposition temperature of about 1000° C. renders the total stress in CVD $Al_2O_3$ coatings on cemented carbide substrates to be tensile. Hence, the total stress is dominated by thermal stresses caused by the difference in the thermal expansion coefficients between the cemented carbide substrate and the coating. The tensile stresses may exceed the rupture limit of $Al_2O_3$ and cause the coating to crack extensively and a network of cooling cracks will be generated over the entire $Al_2O_3$ layer.

Alternative deposition methods for the production of refractory coatings such as alumina, are desirable, particularly methods capable of operating at lower substrate temperatures which therefore not only allow more temperature sensitive tool substrates to be coated, such as high speed steel, but also eliminates cooling cracks caused by the thermal stresses in the coating. A refractory coating deposited at lower temperatures would also result in a finer grain structure and possibly, a higher hardness of the coating.

Potential low temperature deposition technologies for the production of refractory coatings such as TiC, TiN and $Al_2O_3$ on cutting tools are PVD (Physical Vapor Deposition) and PACVD (Plasma Activated CVD). However, certain problems arise when employing these plasma-based techniques for the deposition of highly insulating layers such as $Al_2O_3$. The alumina layer grows not only on the substrates but equally on all surfaces in the vicinity of the plasma as well as on the cathodes/electrodes. Furthermore, these insulating layers will become charged which may cause electrical breakdown and arcing. This latter phenomenon naturally effects both the growth rate and the quality of the coating in a detrimental way.

One solution to the above problems has been the invention of the bipolar pulsed DMS technique (Dual Magnetron Sputtering) which is disclosed in DD 252 205 and U.S. Pat. No. 5,698,314. In the bipolar dual magnetron system, the two magnetrons alternately act as an anode and as a cathode and hence, preserve the magnetron targets in a metallic state over long process times. At high enough frequencies, possible surface charging on the insulating layers will be suppressed and the otherwise troublesome phenomenon of arcing will be limited. According to U.S. Pat. No. 5,698,314, the DMS sputtering technique is capable of depositing and producing high-quality, well-adherent, crystalline α-$Al_2O_3$ thin films at substrate temperatures less than 800° C.

The PVD techniques in general have, due to the low process pressure, the disadvantage of being so-called "line of sight" methods, i.e., only surfaces facing the ion source will be coated. This disadvantage can to a certain extent be compensated for by rotating the substrates during the deposition.

A prior art Plasma Assisted CVD method for the deposition of $Al_2O_3$ layers of the α- and/or γ-$Al_2O_3$ polymorphs at substrate temperatures between 450° and 700° C. is disclosed in U.S. Pat. Nos. 5,516,588 and 5,587,233. This PACVD process includes the reaction between an Al-halogenide, e.g., $AlCl_3$, and $CO_2$, $H_2$ and Ar in a plasma generated by applying a unipolar pulsed DC voltage on the substrate body connected as a cathode which means that the substrate is constantly held at a negative potential. A disadvantage with the DC voltage generation of plasmas, including the unipolar pulsed DC voltage technique, is that the surface charging on the nonconducting layers cannot totally be suppressed. Specifically, the charging is most severe on sharp corners and along edges of the substrates resulting in a significant decrease in the layer thickness and also in the quality of the coating.

In more general terms, the fact that the insulating alumina layer grows not only on the substrates but equally on all surfaces in the vicinity, the plasma as well as on the electrodes, will negatively influence the stability of the plasma and the entire deposition process may eventually end in the extinction of the discharge.

Still another factor which effects the growth rate of the coating is that the deposition process will be interrupted every time the unipolar pulsed DC voltage is at zero potential. In U.S. Pat. No. 5,093,151, the unipolar pulsed DC voltage being used to produce the plasma is deliberately not allowed to attain zero potential between the pulses but is held at a residual potential which is always larger than the lowest ionization potential of any of the element in the reaction mixture H, $H_2$, Ar, O, $O_2$ and $AlCl_3$. The ratio of the residual voltage and the maximum voltage of the pulse is said to be 0.02–0.5. By not allowing the voltage to attain zero potential may have a preferable effect on the deposition rate but simultaneously results in a more severe charge built-up on non-conducting surfaces.

OBJECTS AND SUMMARY OF THE INVENTION

It is an object of this invention to avoid or alleviate the problems of the prior art.

It is further an object of this invention to provide a method for depositing fine-grained, crystalline $Al_2O_3$ coatings on cutting tools.

It is an aspect of the invention to provide a Plasma Activated CVD method for the coating of cutting tools comprising providing a cutting tool substrate body of a material selected from the group consisting of cemented carbides, cermets, ceramics or a high speed steel; and applying an alumina coating to said body using a plasma produced by a bipolar pulsed DC voltage applied between two electrodes to which the body is electrically connected, said plasma formed from $AlCl_3$, $H_2$ and Ar together with an oxygen donor, the pulse frequency being between 5 and 100 kHz, the pulse amplitude being in the range of 300 to 1000 volts and the substrate temperature being in the range of 500° to 800° C.

DETAILED DESCRIPTION OF THE PREFERRED EMBODIMENTS OF THE INVENTION

The present method is based on a plasma activation of a reaction mixture of the chemical reactants $AlCl_3$, $H_2$ and Ar together with an oxygen donor $O_2$, $CO_2$, CO and $N_2O$. Preferably, the oxygen donor is $O_2$. The plasma is produced by applying a bipolar pulsed DC voltage across two electrodes or two sets of electrodes to which the substrate bodies to be coated are fixtured and electrically connected. Alternatively, the reactor wall may serve as an electrode. The two electrodes or the two sets of electrodes alternately act as anode(s) and cathode(s). The alternation of the voltage pulse applied to the electrodes between positive and negative potential has several advantages. First, the undesirable built-up electrical charge on non-conducting surfaces during the negative pulse period will be discharged during the positive pulse period and, by selecting a high enough frequency >5 kHz of the bipolar pulsed DC voltage, arcing can be eliminated. This will permit stable, long-term processing. Second, if no pause time between the positive and the negative pulses is allowed for, the plasma will constantly be activated resulting in a higher deposition rate compared to prior art unipolar pulsed DC voltage techniques. A further advantage of the present method is that the growth rate of the coating is practically constant on all surfaces alike, edges, corners and flat surfaces of the body subjected to coating. The present method, bipolar pulsed DC voltage PACVD, can also successfully be used for the deposition of non-insulating coatings such as TiC, TiN, TiCN and TiAlN, or other carbides and/or nitrides with the metal element chosen from Nb, Hf, V, Ta, Mo, Zr, Cr, and W.

Figure 1:
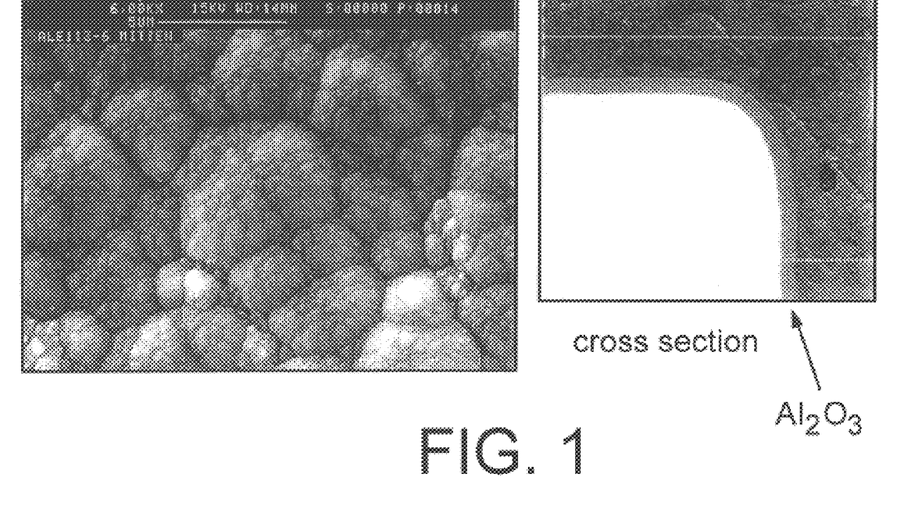
FIG. 1 shows a photomicrograph of the top surface and another micrograph of a polished cross section of an $\alpha$-$Al_2O_3$ coating deposited on a cemented carbide cutting tool with the bipolar pulsed DC voltage PACVD technique.

FIG. 1 shows a micrograph of the top surface and another micrograph of a polished cross section of an $\alpha$-$Al_2O_3$ coating deposited on a cemented carbide cutting tool with the bipolar pulsed DC voltage PACVD technique.

Figure 2:
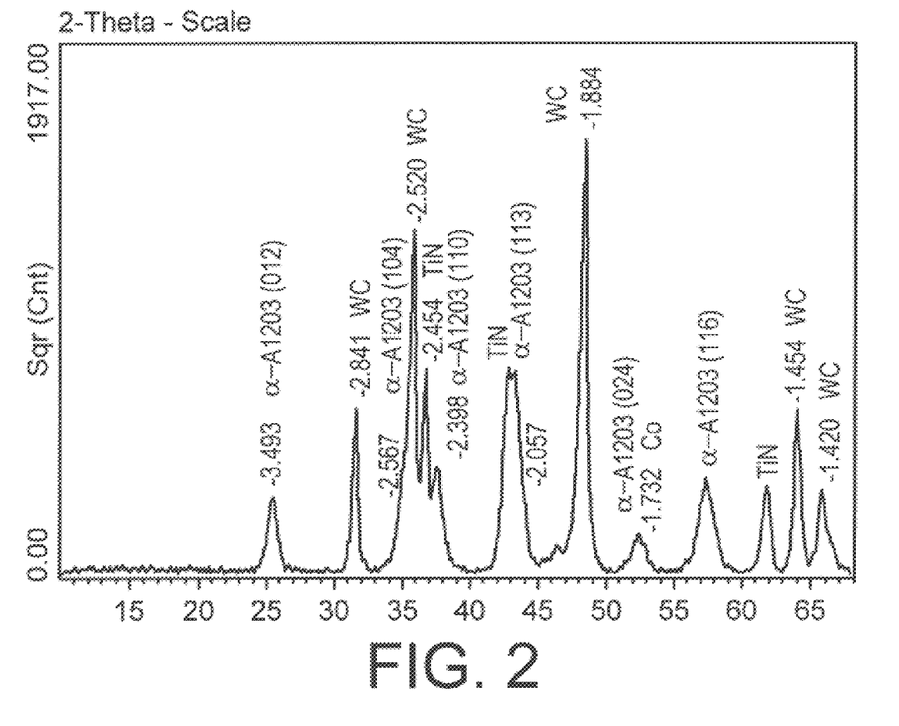
FIG. 2 shows an X-ray Diffractogram (XRD) of the same $\alpha$-$Al_2O_3$ coating as in FIG. 1.

FIG. 2 shows an X-ray Diffractogram (XRD) of the same $\alpha$-$Al_2O_3$ coating as in FIG. 1. The alpha phase of alumina is unequivocally defined by the reflexes from the (012), (104), (110), (113), (024) and (116) planes.

Figure 3:
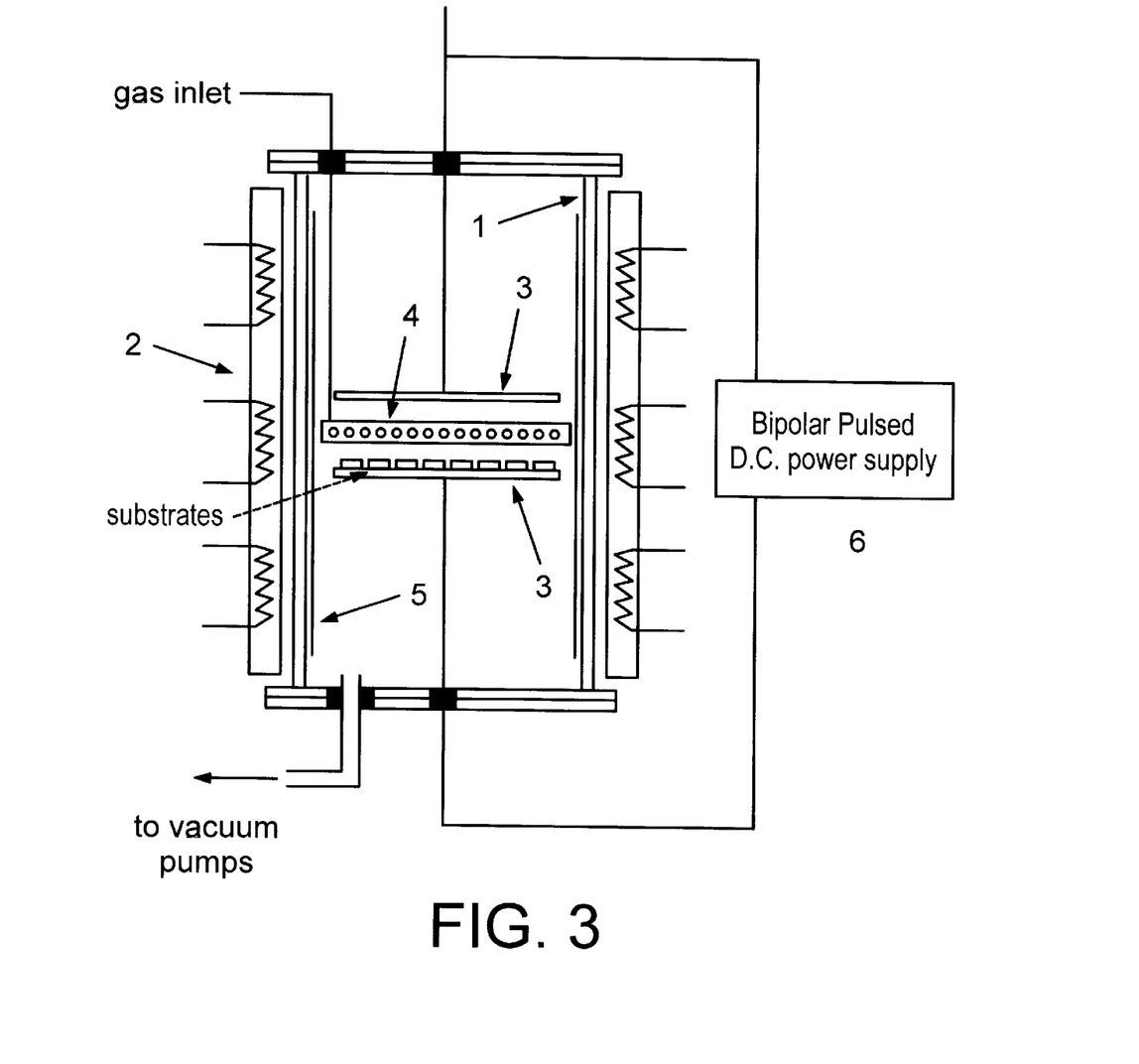
FIG. 3 shows a reactor tube (1), a resistance heated furnace (2), electrodes (3), a gas distributor (4), shield (5) and power supply (6).

The coating equipment used for the present process is depicted in its simplest form in FIG. 3 with a reactor tube (1), a resistance heated furnace (2), electrodes (3), a gas distributor (4), shield (5) and power supply (6). The substrates to be coated can be placed on any of the two electrodes or on both electrodes. For practical purposes the substrates are placed on the lower electrode in this particular electrode arrangement.

Figure 4:
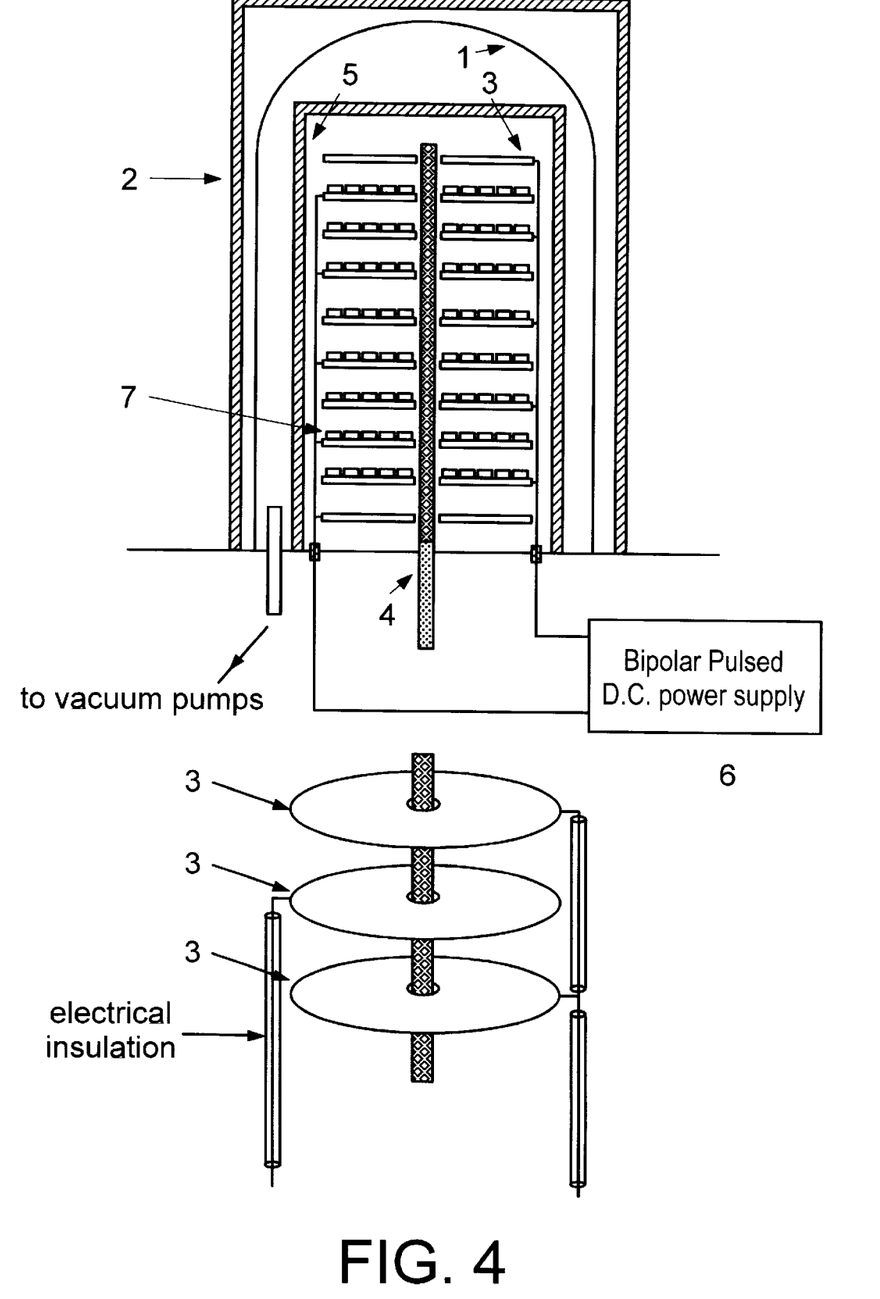
FIG. 4 shows a different coating system with a reactor retort (1), a resistant heated furnace (2), electrodes (3), gas inlet tube (4), shield (5), power supply (6) and tool substrates to be coated (7).

FIG. 4 shows a different coating system with a reactor retort (1), a resistance heated furnace (2), electrodes (3), gas inlet tube (4), shield (5), power supply (6) and tool substrates to be coated (7). This coating system may be suitable for the mass production of, e.g., alumina coated cemented carbide cutting tools. In this system all the electrodes in the reactor serve as substrate tables/holders and the reactants are fed into the reactor through a center pipe.

Figure 5:
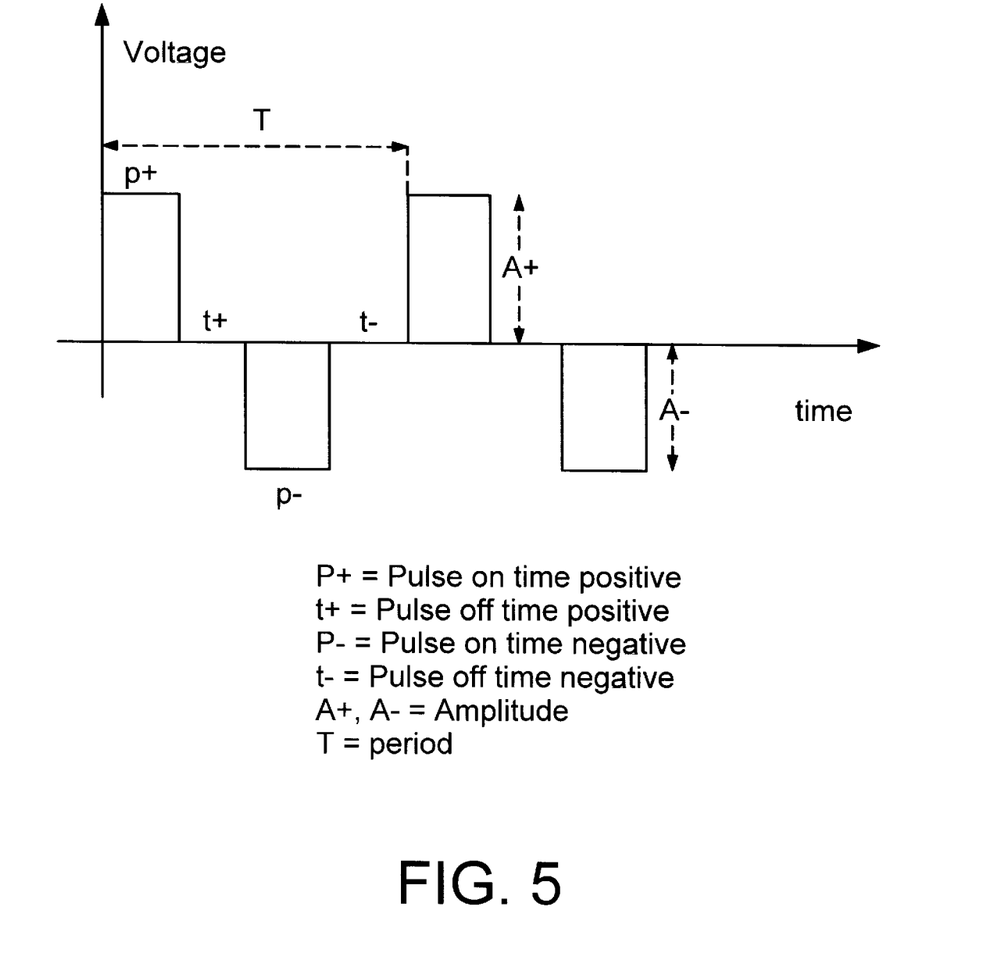
FIG. 5 shows the variability of frequency, pulse amplitudes, positive and negative pulse on/off time when applying the bipolar pulsed DC voltage technique.

In order to attain optimum coating quality and growth rate when applying the bipolar pulsed DC voltage technique, the frequency, pulse amplitudes, positive and negative pulse on/off times can be varied which is illustrated in FIG. 5. A frequency in the range 5–100 kHz can be used, preferably 8–20 kHz. The pulse amplitudes can vary between 300 and 1000 Volts, preferably between 600 and 900 Volts, and the negative and positive pulse on times as well as the negative and positive pulse off times (zero potential) within the period T of the pulsed DC voltage can also be varied in order to modify the coating properties and the stability of the process. Following the definitions of the parameters $6P_+$, $P_-$, $t_+$, $t_-$, $A_+$ and $A_-$ below:

Pulse on time positive = P₊
Pulse off time positive = t₊
Positive pulse Amplitude = A₊
Pulse on time negative = P_
Pulse off time negative = t_
Negative pulse amplitude = A_ where $P_- \geq P_+ \geq 0.1\, P_-$, preferably $0.5\, P_- \geq P_+ \geq 0.1\, P_-$, and where also $P_- \geq 0.1T$. The negative and positive pulse off times should be set to larger or equal to zero, i.e., $t_- \geq 0$ and $t_+ \geq 0$. The amplitude $A_+$ is essentially of equal magnitude as amplitude $A_-$.

The following gas composition, process pressure and substrate temperature may be used:

|  | Possible Range | Preferred Range |
|---|---|---|
| AlCl₃ | 0.1–2% | 0.2–0.4% |
| O₂ | 0.1–3.9% | 0.1–2.0% |
| H₂ | 25–95% | 70–80% |
| Ar | 5–75% | 20–30% |
| Process Pressure | 0.05–1 kPa | 0.1–0.4 kPa |
| Substrate Temperature | 500°–800° C. | 600°–700° C. |

It is within the purview of the skilled artisan to determine whether the requisite grain size and phase compositions have been obtained and to modify the deposition conditions in accordance with the present specification, if desired, to effect the structure of the Al₂O₃ coating within the frame of the invention.

The invention is additionally illustrated in connection with the following Examples which are to be considered as illustrative of the present invention. It should be understood, however, that the invention is not limited to the specific details of the Examples.

EXAMPLE 1

A) Cemented carbide inserts of style CNMA 120412-KR having a composition of 6 w % Co and balance WC were coated with a first layer of 6 μm TiCN and thereafter with a top layer of 1.5 μm κ-Al₂O₃. Both the TiCN and the Al₂O₃ layer were deposited by conventional CVD technique. The Al₂O₃ layer had an average grain size of 1 μm.

B) Cemented carbide inserts of the same style and composition as in A were first coated with an approximately 2.5 μm TiN layer by an ion plating technique.

C) Inserts from B were coated with 5.3 μm fine-grained α-Al₂O₃ layer in a separate experiment with the bipolar pulsed DC voltage PACVD technique under the conditions given below:

D) Inserts from B were coated with 5.9 μm fine-grained γ-Al₂O₃ layer in a separate experiment with the bipolar pulsed DC voltage PACVD technique under the conditions given below:

|  | C | D |
|---|---|---|
| AlCl₃ | 0.4% | 0.2% |
| O₂ | 0.4% | 0.3% |
| H₂ | 76% | 76% |
| Ar | 24% | 24% |
| Pressure | 0.2 kPa | 0.2 kPa |
| Temperature | 700° C. | 700° C. |
| Frequency | 16.6 kHz | 16.6 kHz |

Pulse on time positive (P₊) = Pulse on time negative (P_)
Pulse off time positive (t₊) = 0
Pulse off time negative (t_) = 0

Figure 6:
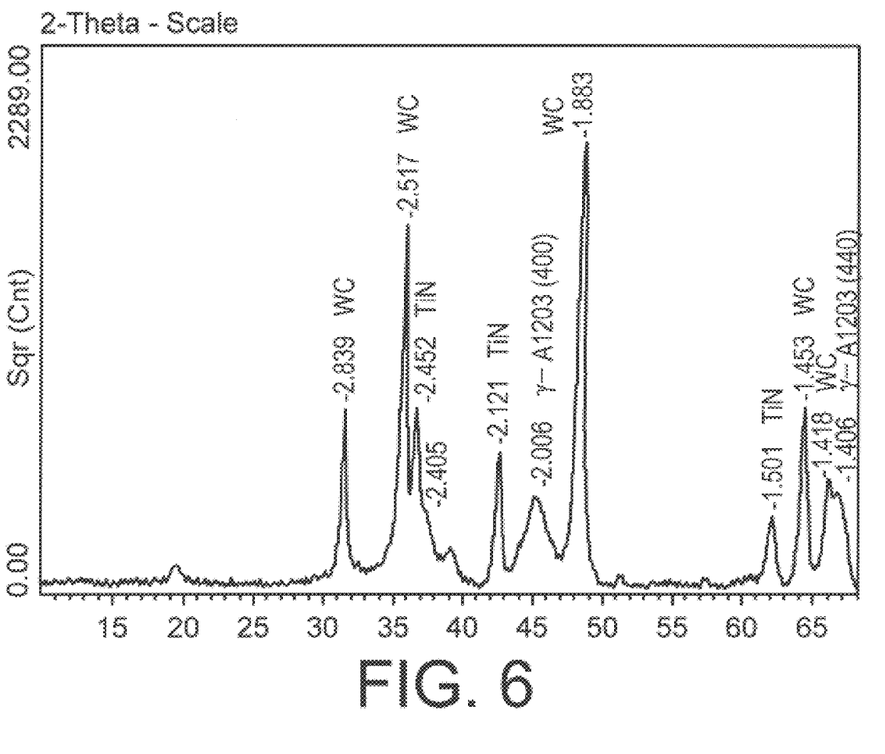
FIG. 6 is a photomicrograph of the top surface of an insert made according to the present invention and an X-ray Diffractogram (XRD) of that surface.

X-ray diffraction (XRD) analysis when using $Cu_{K\alpha}$ radiation, chlorine concentration analysis and hardness measurements HV(0.02) gave the following results:

|  | C | D |
|---|---|---|
| XRD | α-Al₂O₃ (FIG. 2) | γ-Al₂O₃ (FIG. 6) |
| HV (0.02) | 21 GPa | 21 GPa |
| Appearance | half transparent | transparent |
| Cl Content | 0.5 at% | 0.5 at % |

Coated inserts from A, C and D were then tested in a continuous turning operation in a ball bearing steel (Ovako 825) under the following conditions:

Speed: 250 m/min

Feed: 0.25 mm/rev

Depth of cut: 2.0 mm

Coolant being used

The cutting operation was periodically interrupted in order to measure the crater wear of the cutting edges. The crater wear was measured in an optical microscope. The machining time until the Al₂O₃ layer was worn through, was registered (i.e. when the inner TiCN coating just becoming visible). In order to define a figure of merit for the intrinsic wear resistance of the Al₂O₃ layers, the thickness (μm) of the Al₂O₃ layer was divided by the above defined machining time (min). The results below express the wear rate figure of merit.

| A) | prior art layers | 1.0 μm/min |
|---|---|---|
| C) | invention α-Al₂O₃ | 0.76 μm/min |
| D) | invention γ-Al₂O₃ | 0.92 μm/min |

From the above results it is obvious that the wear resistance of the fine-grained γ-Al₂O₃ and the α-Al₂O₃ layer produced with the present method is surprisingly at least as good as the wear resistance of the coarser grained κ-Al₂O₃ layer deposited by CVD technique.

The following two examples demonstrate further possibilities of the present method to obtain Al₂O₃ coatings with slightly different grain morphology and XRD-pattern.

EXAMPLE 2

E) Cemented carbide inserts of style CNMA 120412-KR having a composition of 6 w % Co and balance WC were coated with a first layer of approximately 2.5 μm TiN by an ion plating technique and thereafter coated with a 3 μm fine-grained Al₂O₃ layer in a separate experiment with the bipolar pulsed DC voltage PACVD technique under the following deposition conditions:

|   | E |
|---|---|
| AlCl₃ | 0.2% |
| O₂ | 0.4% |
| H₂ | 76% |
| Ar | 24% |
| Pressure | 0.2 kPa |
| Temperature | 550° C. |
| Frequency | 16.6 kHz |

Pulse on time positive ($P_+$) = Pulse on time negative ($P_-$)
Pulse off time positive ($t_+$) = 0
Pulse off time negative ($t_-$) = 0

Figure 7:
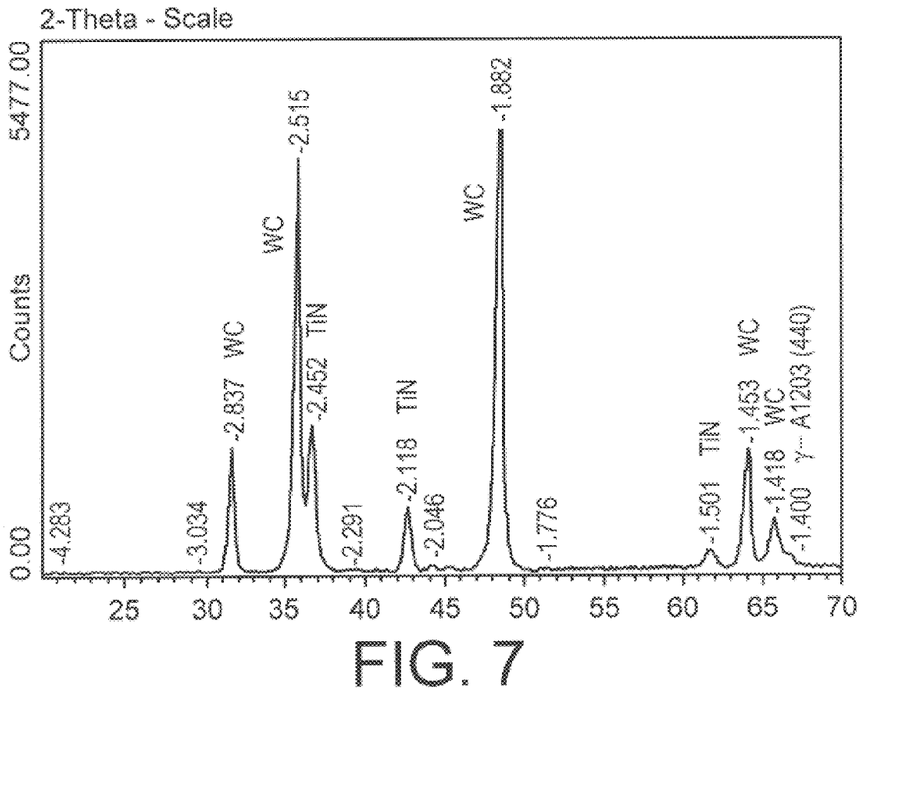
FIG. 7 is a photomicrograph of the top surface of an insert made according to the present invention and an X-ray Diffractogram (XRD) of that surface.

XRD analysis (FIG. 7) showed a broad peak at the 2θ angle 66.8° corresponding to the (440) planes of γ-Al₂O₃. The broad XRD peak indicates a very fine-grained γ-Al₂O₃. The microhardness HV(0.02) of the coating was determined to 19 GPa. A chlorine concentration of 1.5 at % was determined. The coating appeared fully transparent.

EXAMPLE 3

F) Cemented carbide inserts of style CNMA 120412-KR having a composition of 6 w % Co and balance WC were coated with a first layer of approximately 2.5 μm TiN layer by an ion plating technique and thereafter coated with a 2.5 μm fine-grained Al₂O₃ layer in a separate experiment with the bipolar pulsed DC voltage PACVD technique under the following deposition conditions:

|   | F |
|---|---|
| AlCl₃ | 0.2% |
| O₂ | 0.4% |
| H₂ | 76% |
| Ar | 24% |
| Pressure | 0.2 kPa |
| Temperature | 650° C. |
| Frequency | 8.3 kHz |

Figure 8:
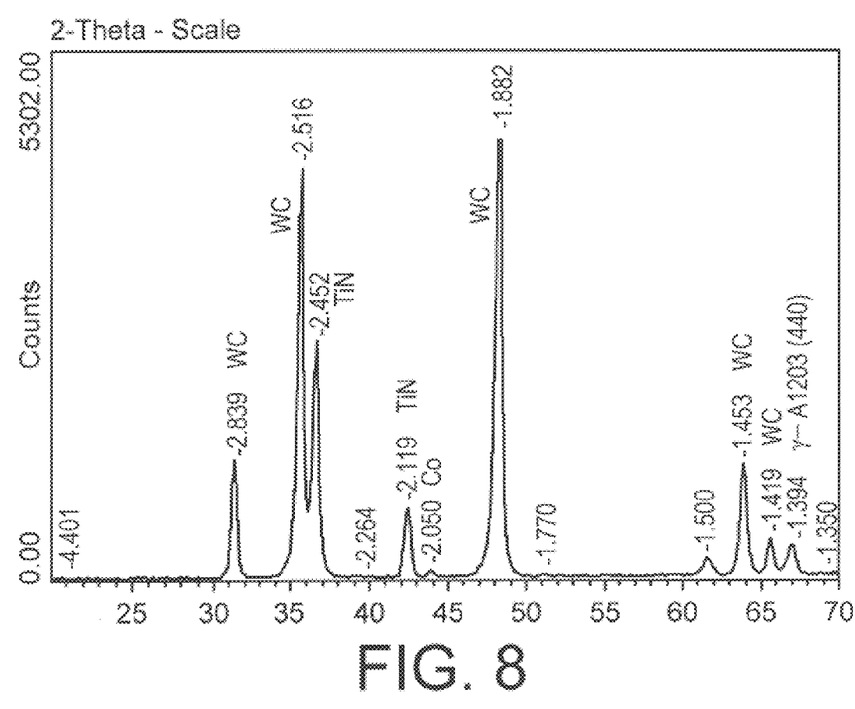
FIG. 8 is a photomicrograph of the top surface of an insert made according to the present invention and an X-ray Diffractogram (XRD) of that surface.

Pulse on time positive ($P_+$) Pulse on time negative ($P_-$)
Pulse off time positive ($t_+$) = 0
Pulse off time negative ($t_-$) = 75 μs XRD analysis (FIG. 8) showed a distinct peak at the 2θ-angle 66.8° corresponding to the (440) planes of γ-Al₂O₃. The microhardness HV(0.02) was determined to 22 GPa.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A Plasma activated CVD method for coating cutting tools comprising providing a cutting tool substrate body of a material selected from the group consisting of cemented carbides, cermets, ceramics or a high speed steel; and applying an alumina coating to said body using a plasma produced by a bipolar pulsed DC voltage applied between two electrodes to which the body is electrically connected, said plasma formed from AlCl₃, H₂ and Ar together with an oxygen donor, the pulse frequency being between 5 and 100 kHz, the pulse amplitude being in the range of 300 to 1000 volts and the substrate temperature being in the range of 500° to 800° C.

2. The method of claim 1 wherein said oxygen donor is selected from the group consisting of O₂, CO₂, N₂O and mixtures thereof.

3. The method of claim 1 wherein the oxygen donor is O₂.

4. The method of claim 3 wherein the AlCl₃ is present in an amount of 0.1–2.0 vol %, the O₂ is present in an amount of 0.1–3.9 vol %, the H₂ is present in am amount of 25–95 vol % and the Ar is present in an amount of 5–75 vol %.

5. The method of claim 4 wherein the AlCl₃ is present in an amount of 0.2–0.4 vol %, the O₂ is present in an amount of 0.1–2 vol %, the H₂ is present in am amount of 70–80 vol % and the Ar is present in an amount of 20–30 vol %.

6. The method of claim 1 wherein the total process pressure is in the range of 0.05 to 1 kPa.

7. The method of claim 6 wherein the total process pressure is in the range of 0.1 to 0.4 kPa.

8. The method of claim 6 wherein the pulse on time negative ($P_-$) is larger or equal to the pulse on time positive ($P_+$), and $P_+$ is larger or equal to 10% and further, the pulse on time negative is larger or equal to 10% of the period T and that the negative and positive pulse off times are set to be larger or equal to zero.

9. The method of claim 8 wherein the amplitudes of the positive ($A_+$) and negative ($A_-$) pulses of the bipolar pulsed DC voltage are of equal magnitude.

* * * * *